(12) United States Patent
Huang

(10) Patent No.: US 10,743,427 B2
(45) Date of Patent: Aug. 11, 2020

(54) DISPLAY APPARATUS

(71) Applicant: Au Optronics Corporation, Hsinchu (TW)

(72) Inventor: Yu-Chun Huang, Hsinchu County (TW)

(73) Assignee: Au Optronics Corporation, Hsinchu (TW)

(*) Notice: Subject to any disclaimer, the term of this patent is extended or adjusted under 35 U.S.C. 154(b) by 0 days.

(21) Appl. No.: 16/504,322

(22) Filed: Jul. 7, 2019

(65) Prior Publication Data
US 2020/0120814 A1    Apr. 16, 2020

(30) Foreign Application Priority Data

Oct. 11, 2018  (TW) .............................. 107135767 A

(51) Int. Cl.
| H04M 1/02 | (2006.01) |
| G06F 1/16 | (2006.01) |
| H05K 5/00 | (2006.01) |
| H05K 5/02 | (2006.01) |
| H05K 5/03 | (2006.01) |

(52) U.S. Cl.
CPC ......... *H05K 5/0017* (2013.01); *G06F 1/1626* (2013.01); *G06F 1/1652* (2013.01); *H04M 1/0237* (2013.01); *H04M 1/0268* (2013.01); *H05K 5/0217* (2013.01); *H05K 5/03* (2013.01)

(58) Field of Classification Search
None
See application file for complete search history.

(56) References Cited

U.S. PATENT DOCUMENTS

| 6,873,315 B2 | 3/2005 | Hemia et al. | |
| 7,636,085 B2 | 12/2009 | Yang | |
| 8,290,871 B1 | 10/2012 | Watson et al. | |
| 8,369,908 B2* | 2/2013 | Hsu ..................... | H04M 1/0235 455/186.2 |
| 9,195,272 B2* | 11/2015 | O'Brien ................ | G06F 1/1624 |
| 10,061,358 B2 | 8/2018 | Lee et al. | |
| 2006/0176243 A1* | 8/2006 | Yeh ..................... | H04M 1/0268 345/30 |
| 2008/0198540 A1* | 8/2008 | Bemelmans ........ | H04M 1/0268 361/679.06 |
| 2009/0147485 A1* | 6/2009 | Higashigawa ...... | H04M 1/0237 361/727 |

(Continued)

FOREIGN PATENT DOCUMENTS

TW    M427643    4/2012

*Primary Examiner* — Xanthia C Cunningham
(74) *Attorney, Agent, or Firm* — JCIPRNET

(57) ABSTRACT

A display apparatus including a cover, a slide rail component and a flexible display component is provided. The slide rail component is disposed under the cover. The slide rail component includes a first rail, at least one first elastic element, at least one first bump and a first sliding block. The first rail has at least one recess. The first elastic element and the first bump are disposed in the first recess. The first bump is disposed between the cover and the first elastic element. The flexible display component has a first edge. A portion of the first edge is fixed to the first sliding block and disposed between the cover and the first sliding block. A display apparatus including a flexible display component, a support component and a guide roller is also provided.

16 Claims, 13 Drawing Sheets

(56) References Cited

U.S. PATENT DOCUMENTS

| | | | |
|---|---|---|---|
| 2010/0009729 A1* | 1/2010 | Maatta | H04M 1/0237 |
| | | | 455/575.4 |
| 2010/0182738 A1* | 7/2010 | Visser | G06F 1/1613 |
| | | | 361/679.01 |
| 2011/0043976 A1 | 2/2011 | Visser et al. | |
| 2013/0225249 A1* | 8/2013 | Jiang | H04M 1/0237 |
| | | | 455/575.3 |
| 2015/0268916 A1 | 9/2015 | Eisenberg | |

* cited by examiner

DISPLAY APPARATUS

CROSS-REFERENCE TO RELATED APPLICATION

This application claims the priority benefit of Taiwan application serial no. 107135767, filed on Oct. 11, 2018. The entirety of the above-mentioned patent application is hereby incorporated by reference herein and made a part of this specification.

BACKGROUND

Field of the Disclosure

The present disclosure relates to a display apparatus, and more particularly to a display apparatus having a flexible display component.

Description of Related Art

With the development of display technology, application of display panels has been extended to a wide range of areas, and the application of flexible display panels has become one of the development priorities of many manufacturers in recent years. Applications of flexible display panels that thinner hard substrates are commonly seen, such as curved TVs, curved monitors, and curved phones, or flexible display panels with flexible substrate, such as wearable devices like watches and clothes, or portable devices like mobile phones and electronic papers and so on. Among them, a flexible display panel equipped with a flexible substrate receives more attention due to its flexibility and impact resistance.

However, although the flexible substrate has better flexibility than the thinned hard substrate, the flexible display panel equipped with the flexible substrate is prone to have warpage on the display surface during operation, causing the display quality and operation comfort to decrease. Therefore, it is one of the problems that all manufacturers are trying to solve to find out how to balance the flexibility required for the flexible display panel in the storage state and the stiffness required in the extended state.

SUMMARY OF THE DISCLOSURE

The disclosure provides a display apparatus with good operation comfort.

A display apparatus according to an embodiment of the disclosure includes a cover, a slide rail component and a flexible display component. The slide rail component is disposed under the cover and includes a first rail, at least one elastic element, at least one first bump, and a first sliding block. The first rail has at least one first recess. The at least one first elastic element and the at least one first bump are disposed in the at least one first recess. The at least one first bump is disposed between the cover and the at least one first elastic element. The first sliding block is slidably disposed on the first rail and disposed between the cover and the first rail. The flexible display component has a first edge. A portion of the first edge is fixed on the first sliding block and disposed between the cover and the first sliding block.

In an embodiment of the disclosure, the at least one first elastic element of the display apparatus has a deformation, and the at least one first bump is disposed between the first sliding block and the first rail.

In an embodiment of the disclosure, the flexible display component of the display apparatus is curved, and the portion of the first edge of the flexible display component and the other portion of the first edge of the flexible display component are respectively disposed on opposite sides of the slid rail component.

In an embodiment of the disclosure, another portion of the first edge of the flexible display component of the display apparatus extends beyond the first sliding block, and the at least one first bump disposed outside the first sliding block is against another portion of the first edge of the flexible display component.

In an embodiment of the present disclosure, the at least one first bump disposed outside the first sliding block in the display apparatus has a surface facing the cover, and the first sliding block has a surface facing the cover. The surface of the at least one first bump disposed outside the first sliding block is substantially coplanar with the surface of the first sliding block.

In an embodiment of the disclosure, the display apparatus further includes a support component. The support component is disposed between the flexible display component and the first rail, and has a plurality of first support portions and at least one hollow portion disposed between the plurality of first support portions. The flexible display component is connected to the support component.

In an embodiment of the disclosure, the display apparatus further includes a guide roller. The flexible display component and the support component are bent in conformity with the guide roller, and the support component is disposed between the flexible display component and the guide roller.

In an embodiment of the disclosure, the flexible display component of the display apparatus has a display portion that is bent in conformity with the guide roller. The display portion of the flexible display component and the at least one hollow portion of the support component are disposed on the guide roller.

In an embodiment of the disclosure, the first rail of the slide rail component of the display apparatus extends in the first direction, and the extending direction of the plurality of first support portions of the support component is staggered with the first direction.

In an embodiment of the disclosure, the support component of the display apparatus further has a plurality of second support portions interlaced with the plurality of first support portions, and the extending direction of the plurality of second support portions of the support component is staggered with the first direction.

A display apparatus according to an embodiment of the disclosure includes a flexible display component, a support component, and a guide roller. The flexible display component has a display portion. The support component is connected to the flexible display component and has a plurality of first support portions and at least one hollow portion disposed between the plurality of first support portions. The display portion of the flexible display component and the at least one hollow portion of the support component are disposed on the guide roller.

In an embodiment of the disclosure, the flexible display component of the display apparatus further has a first display portion, and the support component further has a solid portion. The first display portion of the flexible display component is disposed on the solid portion of the support component.

In an embodiment of the disclosure, the display portion of the flexible display component of the display apparatus and the first support portion of the support component are bent in conformity with the guide roller. The support component is disposed between the flexible display component and the guide roller.

In an embodiment of the disclosure, the guiding roller of the display apparatus extends in the first direction, and the extending direction of the plurality of first support portions of the support component is staggered with the first direction.

In an embodiment of the disclosure, the support component of the display apparatus further has a plurality of second support portions interlaced with the plurality of first support portions, and the extending direction of the plurality of second support portions of the support component is staggered with the first direction.

Based on the above, the display apparatus according to the embodiment of the present disclosure can fix the sliding block connected to the flexible display component on a corresponding position of the rail through the bump and the elastic element disposed in the recess of the rail depending on the size of the display area needed by the user, thereby avoiding that the sliding block is slid under the influence of unanticipated external force, thus enhancing operation (e.g., watching, touching) comfort for the user. In addition, the display apparatus of the embodiment of the present disclosure connects the flexible display component through the support component having the hollow portion to improve the flatness of the display surface of the flexible display component, while reducing the stress generated on the connection surface when the flexible display component and the support component are bent.

In order to make the aforementioned features and advantages of the disclosure more comprehensible, embodiments accompanying figures are described in detail below.

DESCRIPTION OF EMBODIMENTS

Figure 1:
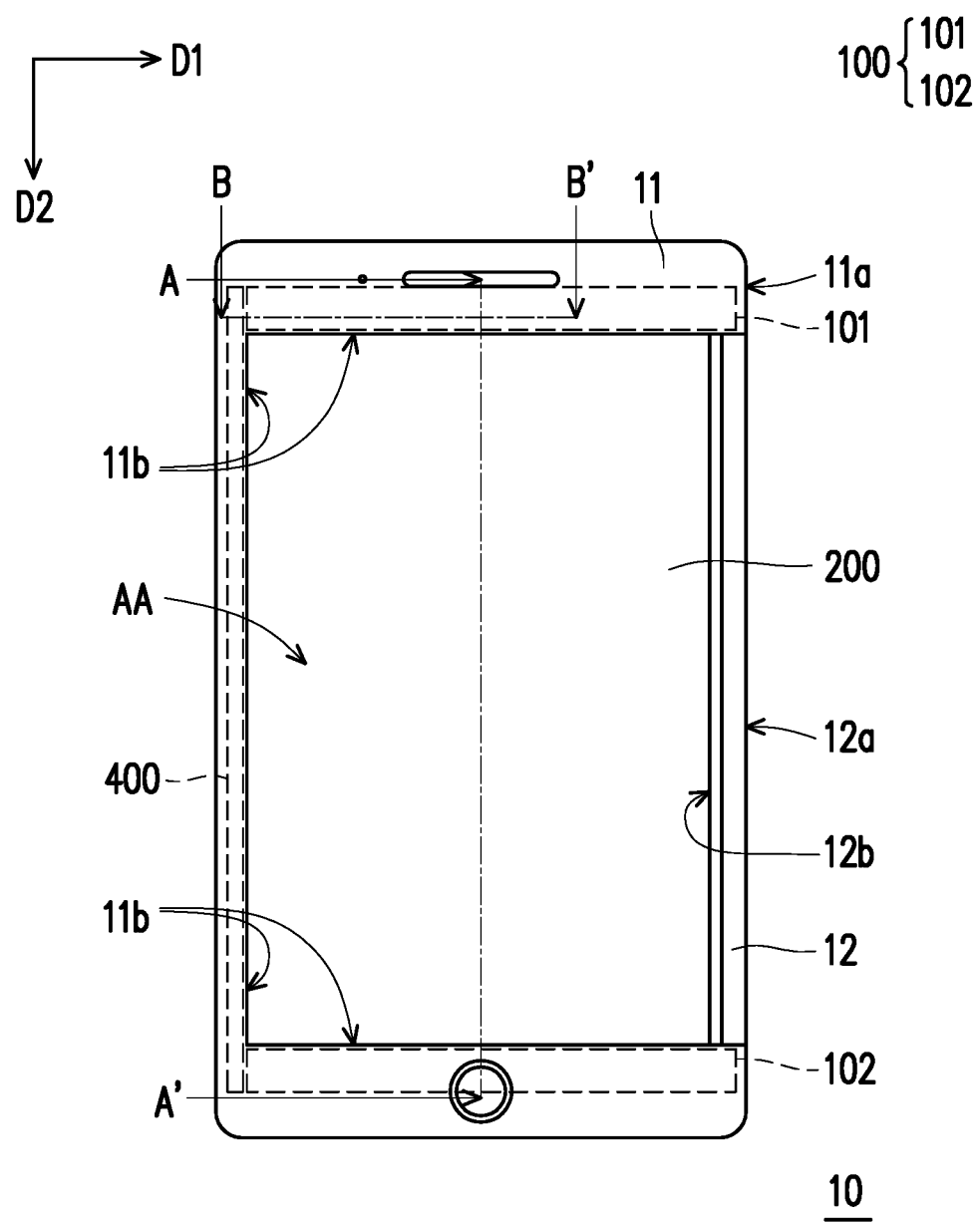
FIG. 1 is a schematic top view of a display apparatus in a closed state according to an embodiment of the disclosure.

Reference will now be made in detail to the exemplary embodiments of the disclosure. Descriptions of the exemplary embodiments are shown in the drawings. Wherever possible, the same reference signs denote the same or similar portions in the drawings and descriptions.

Figure 2:
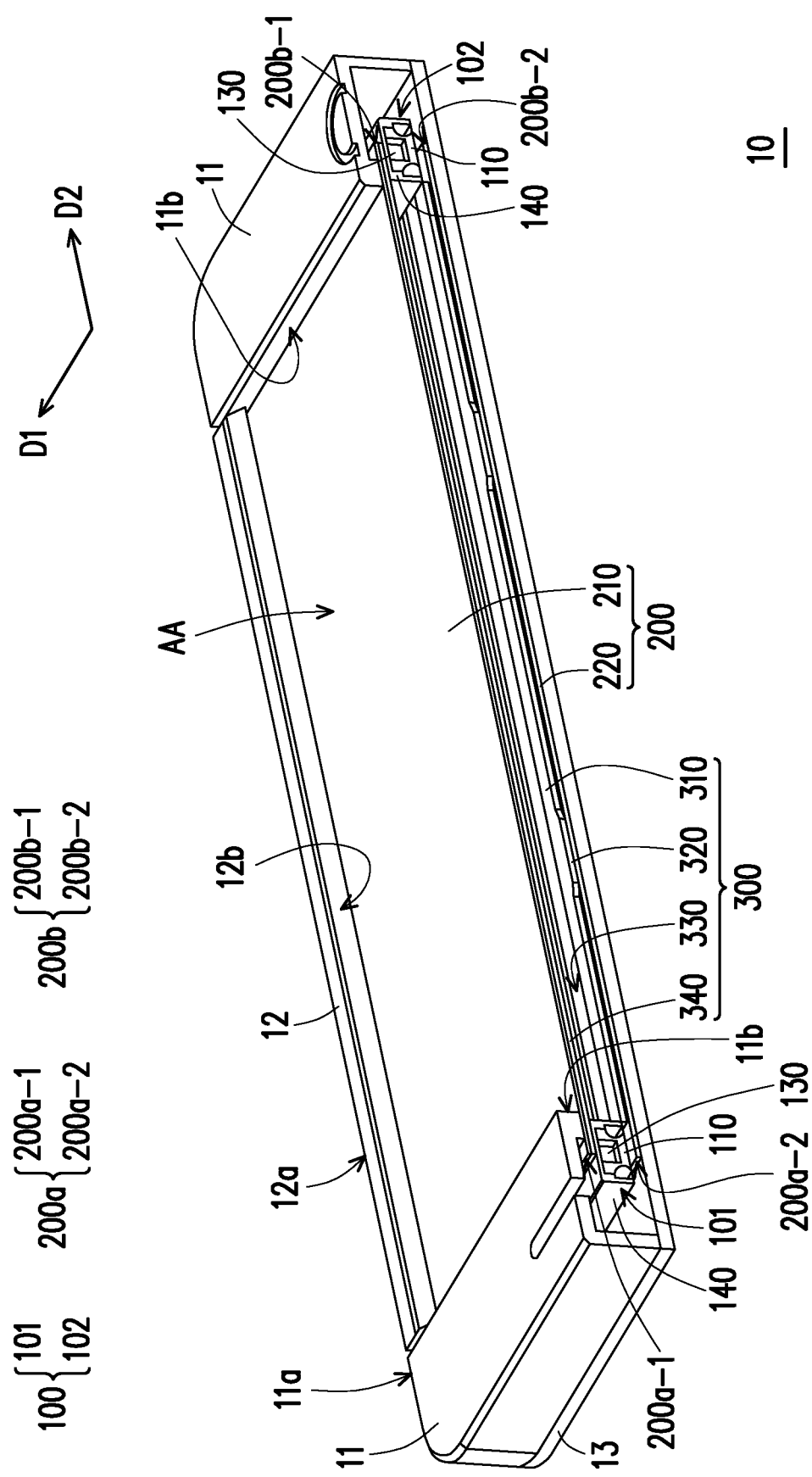
FIG. 2 is a schematic cross-sectional side view of the display apparatus of FIG. 1 in a closed state.
Figure 3:
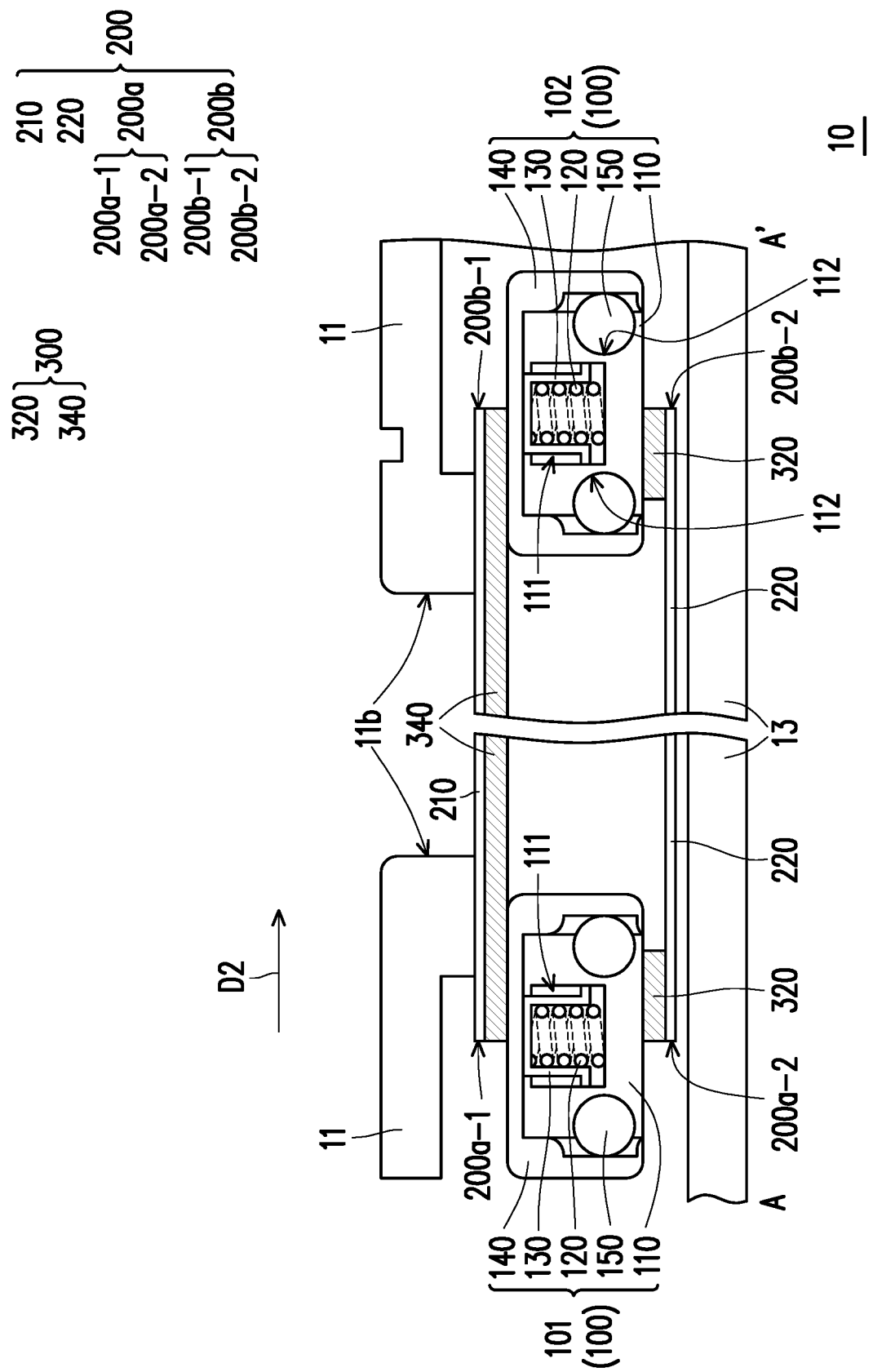
FIG. 3 is a schematic cross-sectional view of the display apparatus of FIG. 1 in a closed state.
Figure 4:
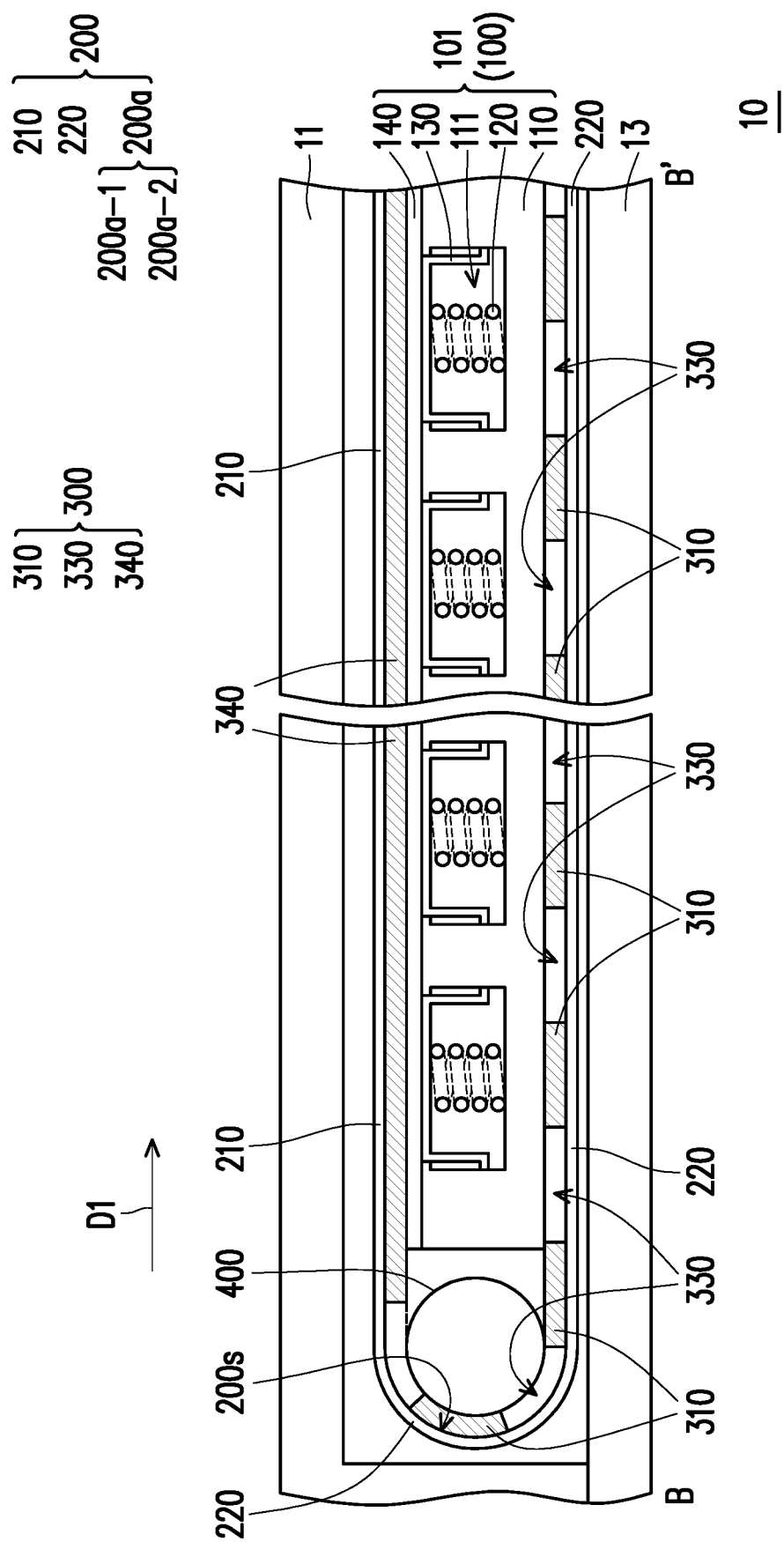
FIG. 4 is a schematic cross-sectional view of the display apparatus of FIG. 1 in a closed state.

FIG. 1 is a schematic top view of a display apparatus 10 in a closed state according to an embodiment of the disclosure. FIG. 2 is a schematic cross-sectional side view of the display apparatus 10 of FIG. 1 in a closed state. FIG. 3 is a schematic cross-sectional view of the display apparatus 10 of FIG. 1 in a closed state. FIG. 4 is a schematic cross-sectional view of the display apparatus 10 of FIG. 1 in a closed state. Specifically, FIG. 3 and FIG. 4 respectively correspond to cross-sectional line A-A' and cross-sectional line B-B' taken along FIG. 1.

Referring to FIG. 1 and FIG. 2, for example, in the embodiment, the display apparatus 10 is applied to a mobile device, such as a smart phone, a tablet, or the like. However, the present disclosure is not limited thereto, and in other embodiments, the display apparatus 10 can also be applied to other electronic devices.

In the present embodiment, the display apparatus 10 includes a cover 11 and side plates 12. The side plate 12 is disposed on one side of the cover 11 and has two edges 12*a*, 12*b* opposite to each other. The cover 11 has an opening 11*b* facing the side plate 12. When the display apparatus 10 is in the closed state, the edge 12*a* of the side plate 12 is substantially aligned with one edge 11*a* of the cover 11, and the opening 11*b* of the cover 11 and the edge 12*b* of the side plate 12 define a display area AA of the display apparatus 10 in a closed state. In the present embodiment, the display apparatus 10 may further include a back plate 13 disposed opposite to the cover 11, but the disclosure is not limited thereto.

Referring to FIG. 2 and FIG. 3, in the embodiment, the display apparatus 10 further includes at least one slide rail component 100 disposed under the cover 11. For example, the display apparatus 10 of the present embodiment may optionally include a first slide rail component 101 and a second slide rail component 102 respectively disposed on opposite sides of the display area AA, but the disclosure is not limited thereto.

Referring to FIG. 2, FIG. 3 and FIG. 4, the slide rail component 100 includes a rail 110 and a plurality of elastic elements 120. The rail 110 extends in the direction D1 and has a plurality of recesses 111 arranged in sequence in the direction D1. A plurality of elastic elements 120 are respectively disposed in the plurality of recesses 111 of the rail 110. In the present embodiment, the elastic element 120 is, for example, a spring, but the disclosure is not limited thereto.

The slide rail component 100 further includes a plurality of bumps 130 and a sliding block 140. The plurality of bumps 130 are respectively disposed in the plurality of recesses 111 of the rail 110 and disposed between the cover 11 and the corresponding elastic element 120. The sliding block 140 is slidably disposed on the rail 110 and disposed between the cover 11 and the rail 110. For example, in the embodiment, the slide rail component 100 may further include a plurality of balls 150 disposed in two opposite grooves 112 of the rail 110. The sliding block 140 is disposed on the rail 110 and the ball 150, and the sliding block 140 is movable relative to the rail 110 in the direction D1 through the rotation of the ball 150. However, the present disclosure is not limited thereto, and in other embodiments, the sliding block 140 may also be movable in the direction D1 by other means.

When the display apparatus 10 is in the closed state, the bump 130 of the slide rail component 100 is disposed between the sliding block 140 and the corresponding elastic element 120, and presses against the bump 130 through the sliding block 140, so that the elastic element 120 has a compressing deformation.

Referring to FIG. 1 and FIG. 4, in the embodiment, the display apparatus 10 may further include a guiding roller 400 disposed under the cover 11. For example, in the present embodiment, the extending direction (i.e., the direction D2) of the guide roller 400 may be substantially perpendicular to the extending direction (i.e., the direction D1) of the rail 110 of the slide rail component 100, but the present disclosure is not limited thereto.

Figure 5:
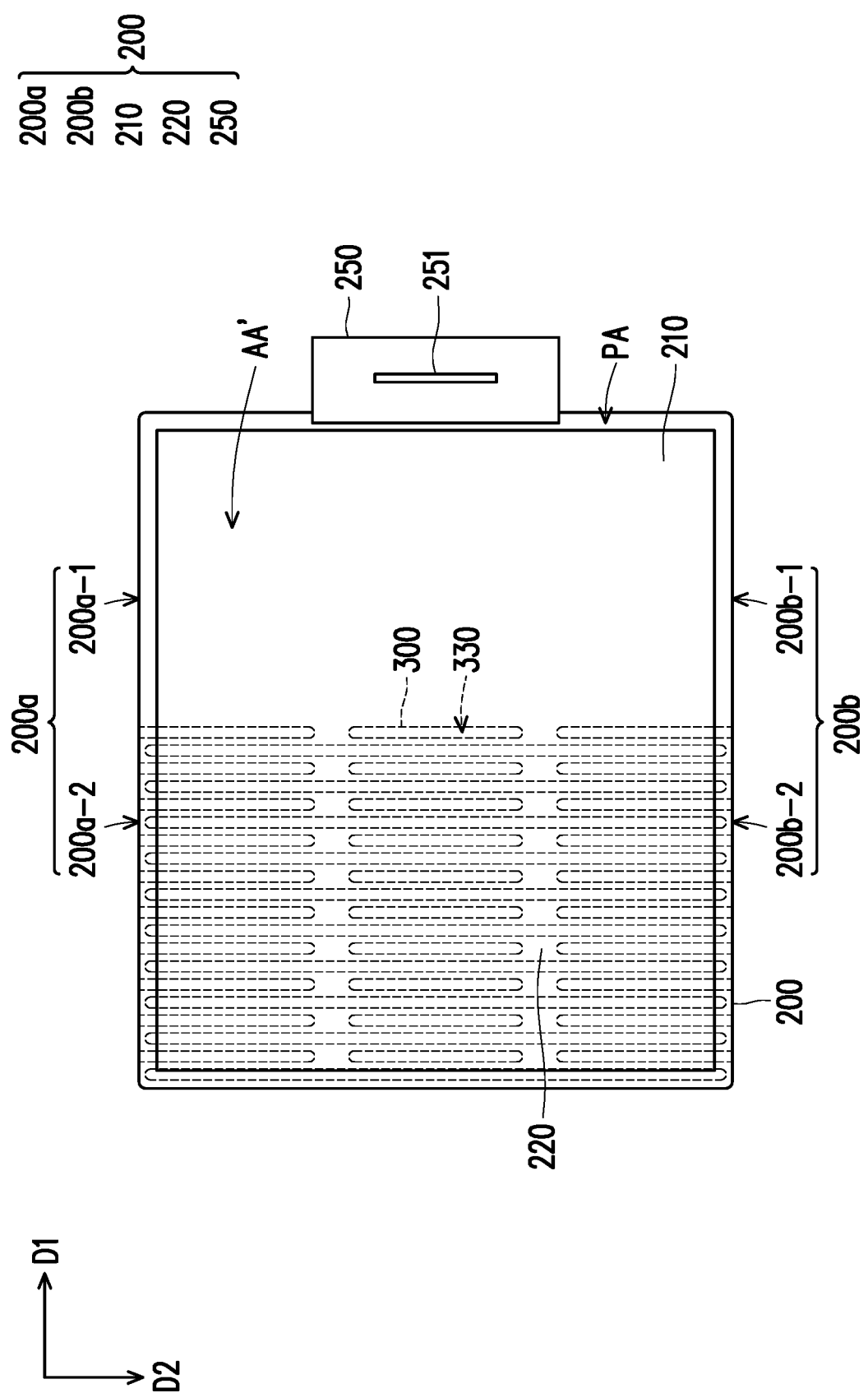
FIG. 5 is a schematic top view showing a flexible display component and a support component of the display apparatus in an unfolded state according to an embodiment of the disclosure.

FIG. 5 is a schematic top view showing a flexible display component 200 and a support component 300 of the display apparatus 10 in an unfolded state according to an embodiment of the disclosure. Referring to FIG. 2 and FIG. 5, the display apparatus 10 further includes the flexible display component 200. The flexible display component 200 has a display area AA', a first edge 200a, and a second edge 200b. The first edge 200a and the second edge 200b are disposed on opposite sides of the display area AA' and are disposed under the cover 11. Specifically, in the present embodiment, the area of the display area AA' of the flexible display component 200 is larger than the area of the display area AA (shown in FIG. 1) defined by the opening 11b of the cover 11 and the edge 12b of the side plate 12 of the display apparatus 10 in the closed state.

The first edge 200a of the flexible display component 200 includes a first portion 200a-1 and a second portion 200a-2. The second edge 200b of the flexible display component 200 includes a first portion 200b-1 and a second portion 200b-2. In the present embodiment, the flexible display component 200 has a first display portion 210 and a second display portion 220. The first display portion 210 is disposed between the first portion 200a-1 of the first edge 200a of the flexible display component 200 and the first portion 200b-1 of the second edge 200b of the flexible display component 200. The second display portion 220 is disposed between the second portion 200a-2 of the first edge 200a of the flexible display component 200 and the second portion 200b-2 of the second edge 200b of the flexible display component 200. Specifically, when the display apparatus 10 is in the closed state, the first display portion 210 of the flexible display component 200 overlaps the display area AA defined by the opening 11b of the cover 11 and the edge 12b of the side plate 12.

Referring to FIG. 3 and FIG. 5, for example, in the embodiment, the first portion 200a-1 of the first edge 200a of the flexible display component 200 is fixed on the sliding block 140 of the first slide rail component 101 and disposed between the cover 11 and the sliding block 140. The first portion 200b-1 of the second edge 200b of the flexible display component 200 is fixed on the sliding block 140 of the second slide rail component 102 and is disposed between the cover 11 and the sliding block 140.

When the display apparatus 10 is in the closed state, the second portion 200a-2 of the first edge 200a of the flexible display component 200 is disposed between the first slide rail component 101 and the back plate 13. The second portion 200b-2 of the second edge 200b of the flexible display component 200 is disposed between the second slide rail component 102 and the back plate 13. In other words, the slide rail component 100 is disposed between the first display portion 210 of the flexible display component 200 and the second display portion 220 of the flexible display component 200.

Referring to FIG. 5, the flexible display component 200 may further include a flexible circuit board 250 bonded to a peripheral area PA of the flexible display component 200, but the disclosure is not limited thereto. In the present embodiment, the flexible circuit board 250 can optionally include a driving chip 251. The driving chip 251 can be electrically connected to a wiring layer (not shown) through a flip chip bonding technique; that is, the flexible circuit board 250 can be a chip on film. However, the present disclosure is not limited thereto. According to other embodiments, the driving chip 251 of the flexible circuit board 250 can also be electrically connected to the peripheral area PA of the flexible display component 200 by using Tape Automated Bonding (TAB) technology; that is, the flexible circuit board 250 may be a Tape Carrier Package (TCP). It should be noted that the present disclosure provides does not limit the flexible circuit board 250 to include the driving chip. According to other embodiments, the flexible circuit board 250 may also be a flexible circuit board that does not have a driving chip.

Figure 6:
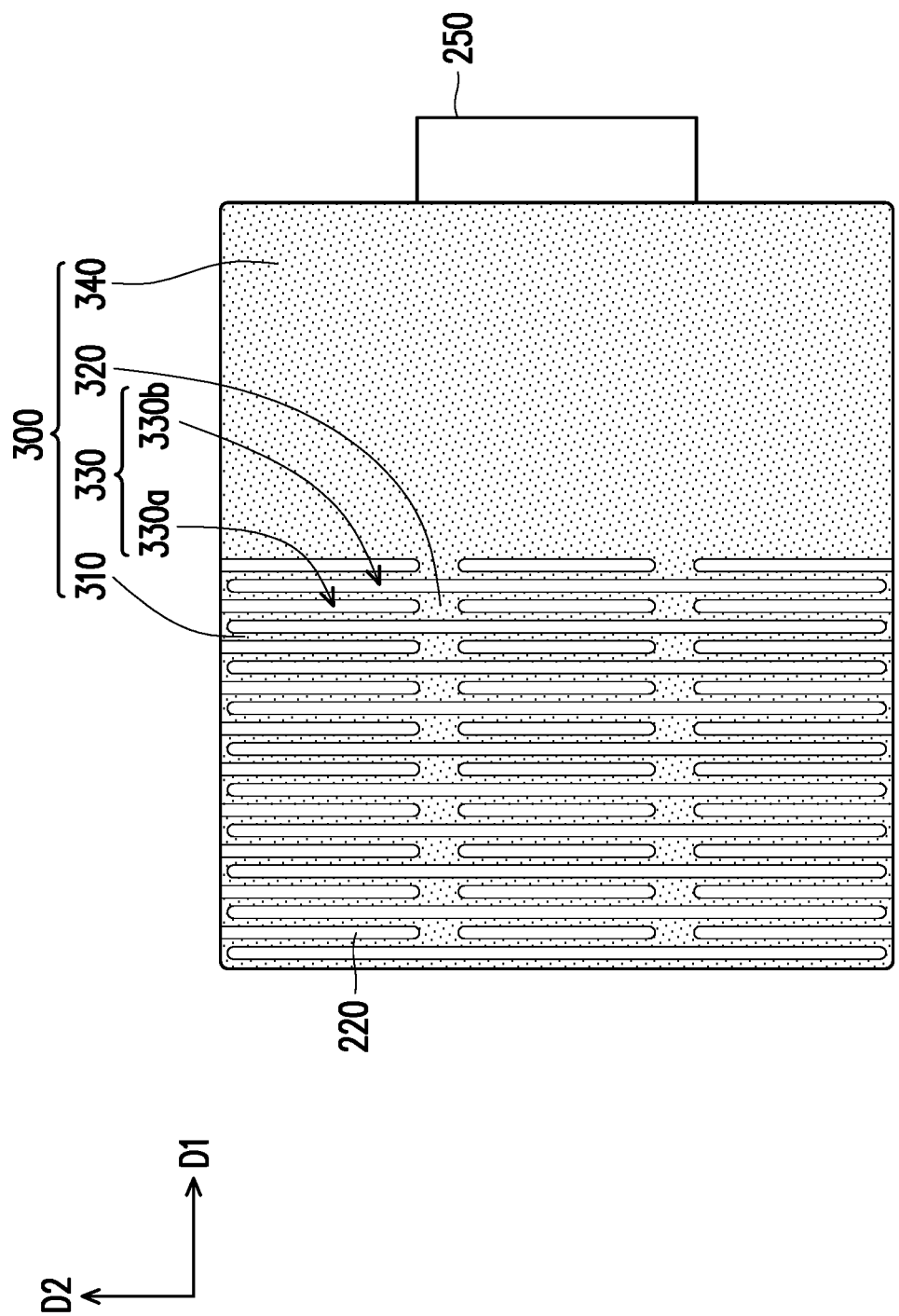
FIG. 6 is a schematic bottom view showing a flexible display component and a support component of the display apparatus in an unfolded state according to an embodiment of the disclosure.

FIG. 6 is a schematic bottom view showing a flexible display component 200 and a support component 300 of the display apparatus 10 in an unfolded state according to an embodiment of the disclosure. Referring to FIG. 3, FIG. 4 and FIG. 6, in the embodiment, the display apparatus 10 may further include the support component 300. The support component 300 has a solid portion 340, a plurality of first support portions 310, a plurality of second support portions 320, and a plurality of hollow portions 330. The solid portion 340 of the support component 300 is connected to the first display portion 210 of the flexible display component 200. The solid portion 340 of the support component 300 overlaps the first display portion 210 of the flexible display component 200.

The first support portion 310 and the second support portion 320 of the support component 300 are connected to the second display portion 220 of the flexible display component 200. A plurality of hollow portions 330 are defined between the plurality of first support portions 310 and the plurality of second support portions 320. The first support portion 310, the second support portion 320, and the hollow portion 330 of the support component 300 overlap the second display portion 220 of the flexible display component 200. For example, in the embodiment, the extending direction (i.e., the direction D2) of each of the first support portions 310 may be substantially perpendicular to the direction D1, and the plurality of first support portions 310 are arranged in the direction D1. Each of the second support portions 320 is connected between two adjacent first support portions 310, and the hollow portion 330 may include an area 330a between the two adjacent first support portions 310 and an opening 330b encircled by the two adjacent first support portions 310 and the two adjacent second support portions 320. A gap between the first support portion 310 and the plurality of second support portions 320 is the hollow portion 330. However, the disclosure is not limited thereto, and in other embodiments, the support component 300 can also be designed in other suitable forms.

It should be noted that since the second display portion 220 of the flexible display component 200 overlaps the hollow portion 330 of the support component 300, the second display portion 220 of the flexible display component 200 is bent more easily than the first display portion 210 of the flexible display component 200. Specifically, at least a portion of the first support portion 310, at least a portion of the second support portion 320, and at least a portion of the hollow portion 330 of the support component 300 are disposed between the second display portion 220 of the flexible display component 200 and the guide roller 400, and a portion of the second display portion 220 of the flexible display component 200 and a portion of the support component 300 can be bent in conformity with the guide roller 400. Through the design of the hollow portion 330, when the second display portion 220 of the flexible display component 200 and the support component 300 are bent in conformity with the guide roller 400, it is possible to reduce the stress generated by the flexible display component 200 and the support component 300 on a connection surface 200s.

Specifically, when the display apparatus 10 is in the closed state, a portion of the second display portion 220 of the flexible display component 200 and the support component 300 are bent in conformity with the guide roller 400 and disposed under the first display portion 110 and the slide rail component 100. That is, most of the second display portion 220 and the first display portion 210 are respectively disposed on the upper and lower sides of the slide rail component 100.

In the present embodiment, the material stiffness of the support component 300 is higher than the overall stiffness of the flexible display component 200. For example, the material of the support component 300 may be selected from metal, polypropylene (PP), or other materials having suitable stiffness.

Figure 7:
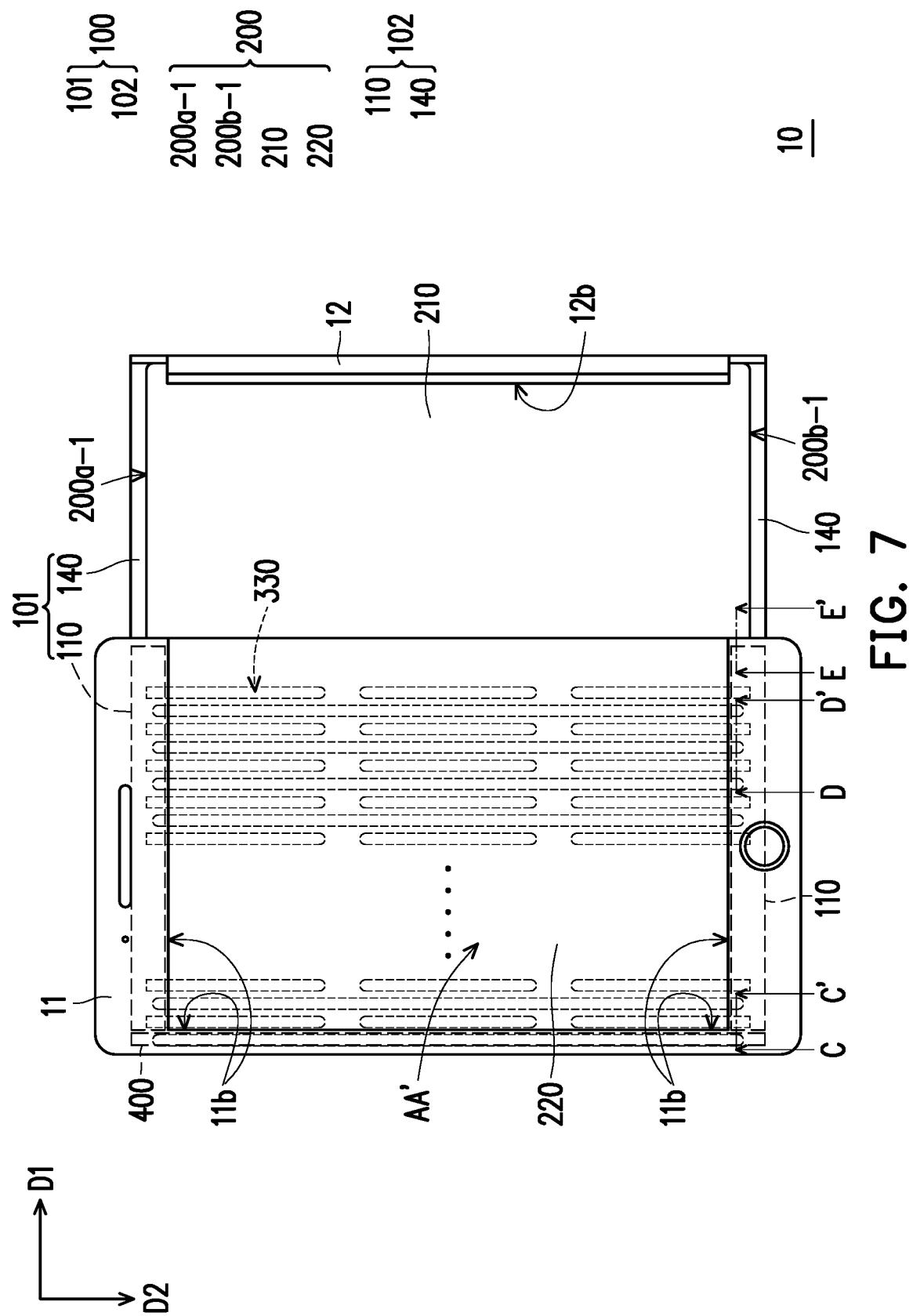
FIG. 7 is a schematic top view of the display apparatus in an extended state according to an embodiment of the disclosure.
Figure 8:
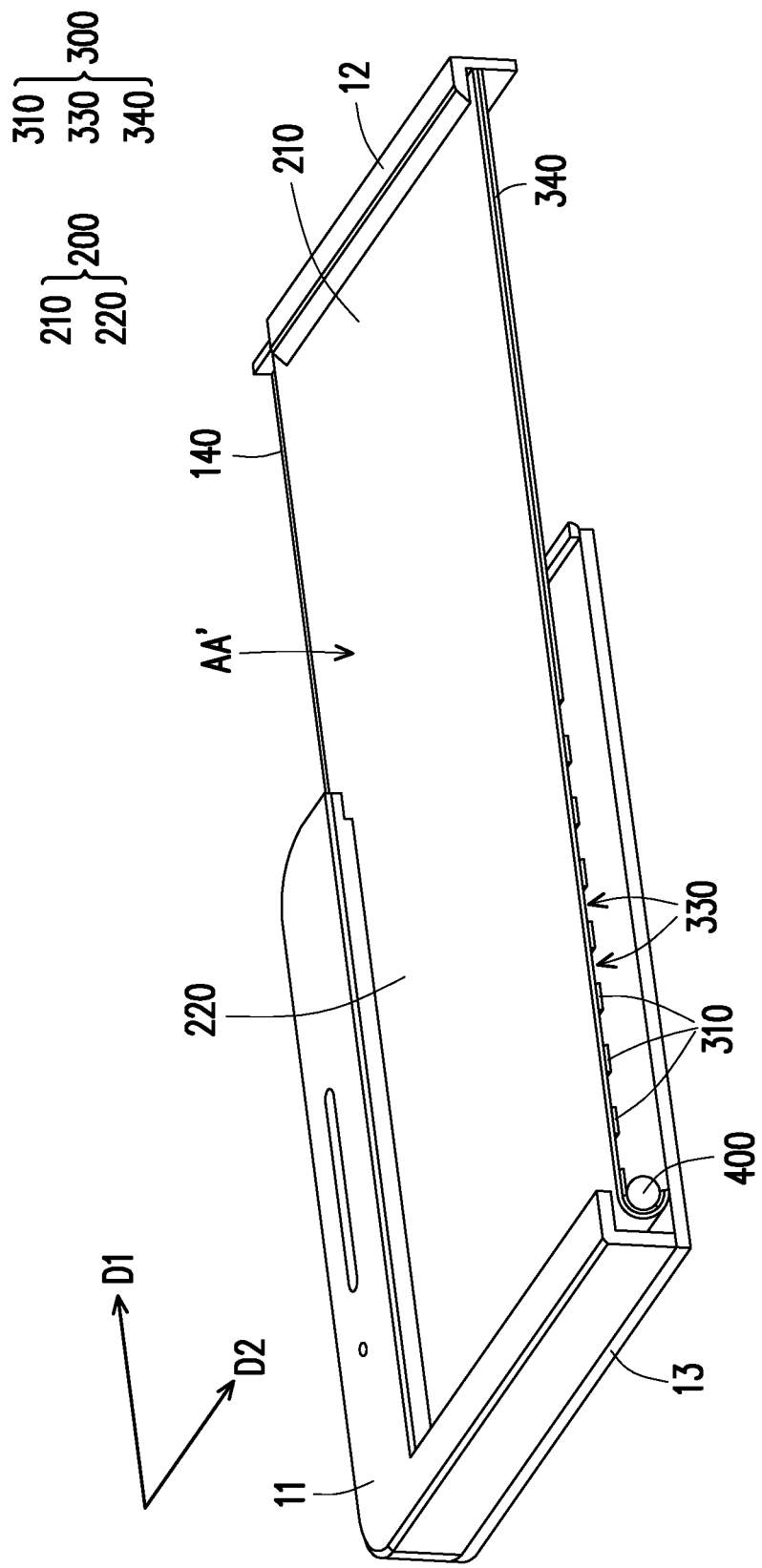
FIG. 8 is a schematic cross-sectional side view of the display apparatus of FIG. 7.
Figure 9:
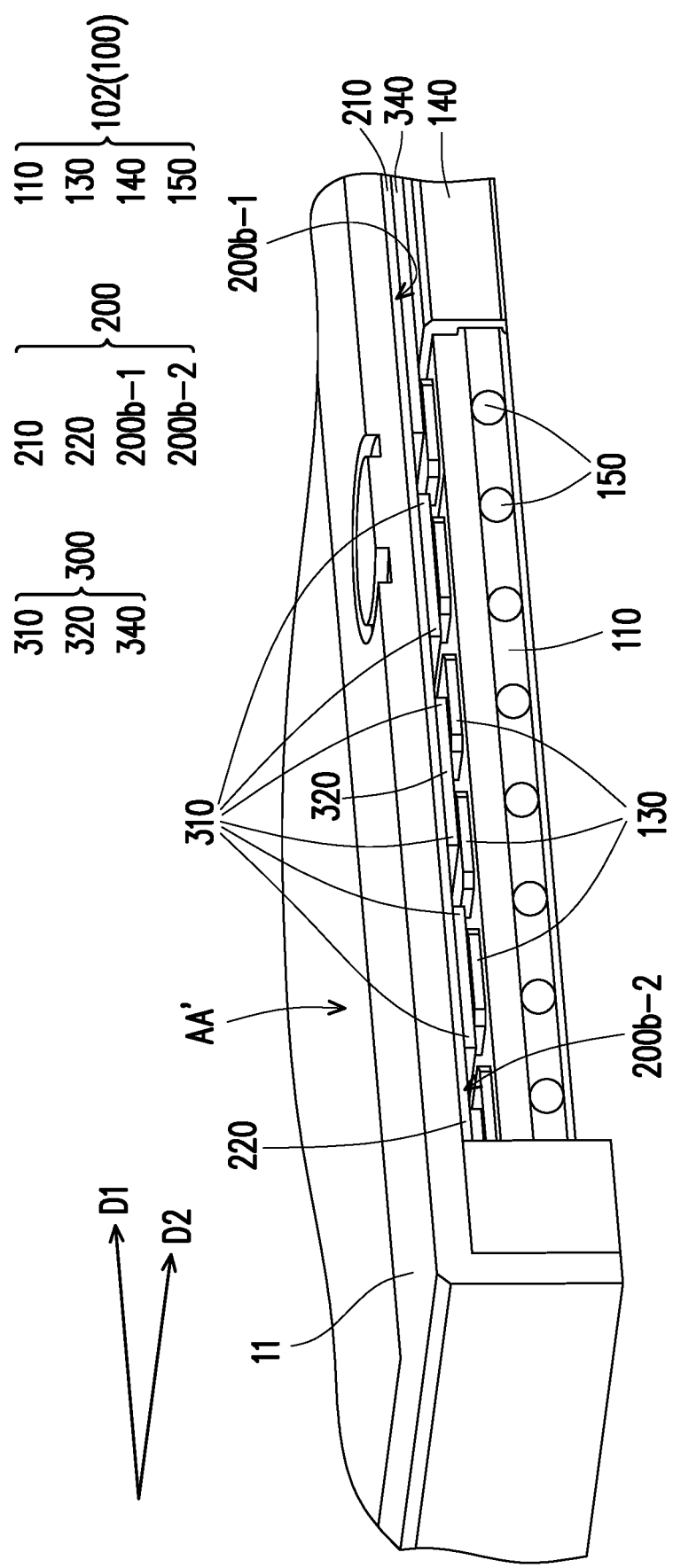
FIG. 9 is a schematic cross-sectional side view of a partial area of the display apparatus of FIG. 7.
Figure 10:
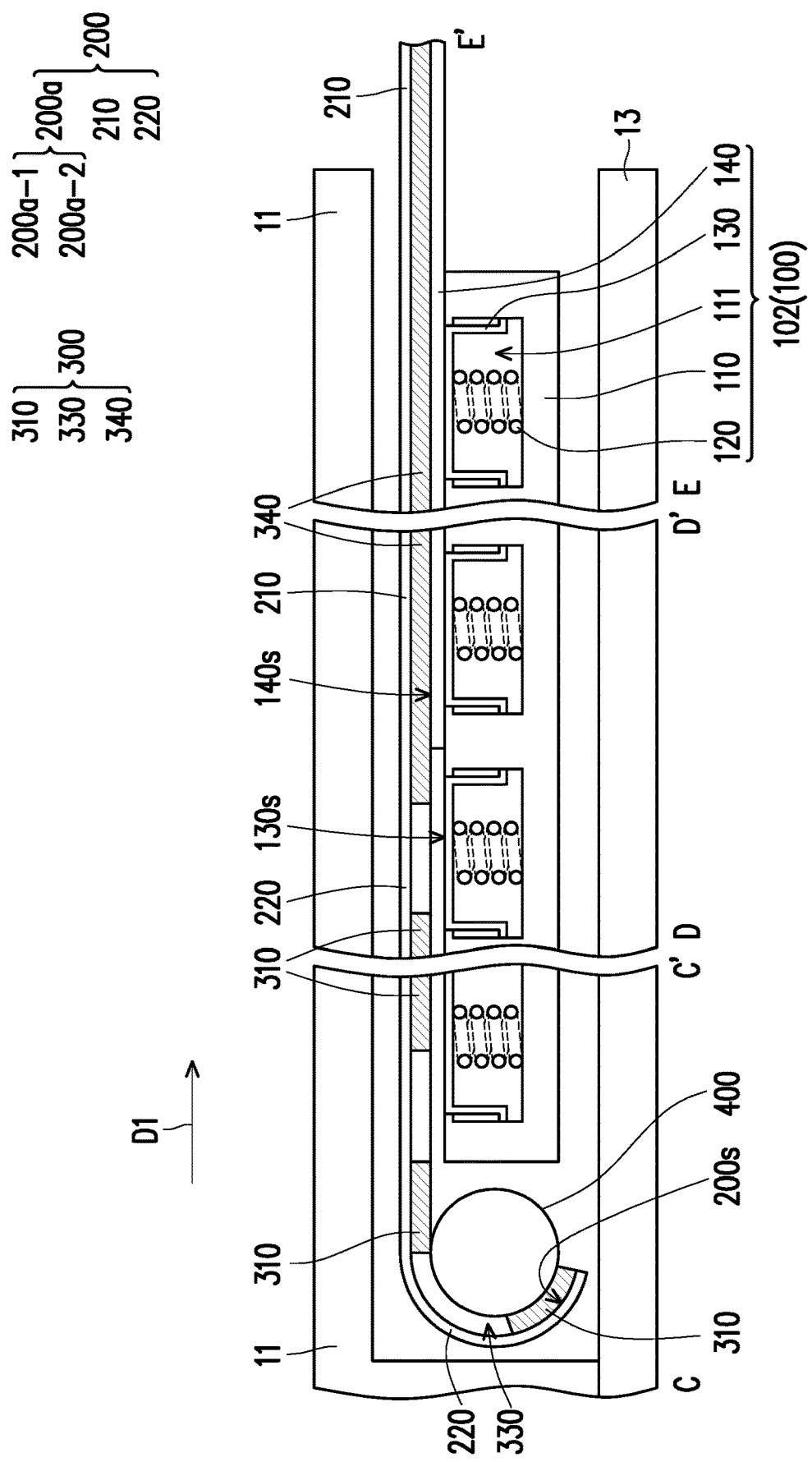
FIG. 10 is a schematic cross-sectional view showing the display apparatus in an extended state according to an embodiment of the present disclosure.

FIG. 7 is a schematic top view of the display apparatus 10 in an extended state according to an embodiment of the disclosure. FIG. 8 is a schematic cross-sectional side view of the display apparatus 10 of FIG. 7. FIG. 9 is a schematic cross-sectional side view of a partial area of the display apparatus 10 of FIG. 7. FIG. 10 is a schematic cross-sectional view showing the display apparatus 10 in an extended state according to an embodiment of the present disclosure. FIG. 10 corresponds to cross-sectional line C-C', cross-sectional line D-D', and cross-sectional line E-E' taken along FIG. 7, respectively.

Referring to FIG. 7 and FIG. 8, when the display apparatus 10 is in the extended state, the second portion 200a-2 of the first edge 200a of the flexible display component 200 is bent in conformity with the guide roller 400 and moved to a position between the rail 110 of the first slide rail component 101 and the cover 11. The second portion 200b-2 of the second edge 200b of the flexible display component 200 is bent in conformity with the guide roller 400 and moved to a position between the rail 110 of the second slide rail component 102 and the cover 11. On this occasion, the display area size of the display apparatus 10 is substantially the same as the display area AA' of the flexible display component 200. However, the user can also adjust the size of the display area of the display apparatus 10 according to actual needs, such as, but not limited to, may be adjusted to two-thirds of the size of the display area AA' of the flexible display component 200.

Referring to FIG. 9 and FIG. 10, in the embodiment, the second portion 200b-2 of the second edge 200b of the flexible display component 200 extends beyond the sliding block 140 of the second slide rail component 102 (or the second portion 200a-2 of the first edge 200a of the flexible display component 200 extends beyond the sliding block 140 of the first slide rail component 101). During the user's adjustment of the size of the display area of the display apparatus 10, the sliding block 140 of the slide rail component 100 slides on the rail 110 in the direction D1, and the bump 130 disposed outside the sliding block 140 is not pressed by the sliding block 140, and is pushed by the elastic element 120 underneath having compressing deformation, such that the bump 130 disposed outside the sliding block 140 is against the support component 300. In this manner, a portion of the flexible display component 200 (e.g., a portion of the second display portion 220) on the raised bump 130 and a portion of the flexible display component 200 (e.g., a portion of the first display portion 220) on the sliding block 140 may be substantially coplanar, which facilitates the user to view the flat display screen while the display apparatus 10 is in the extended state.

In detail, when the display apparatus 10 is in the extended state, the bump 130 of the second slide rail component 102 (or the first slide rail component 101) disposed outside the sliding block 140 is against the first support portion 310 and the second support portion 320 connected to the second display portion 220 of the flexible display component 200. However, the present disclosure is not limited thereto. According to other embodiments, the bump 130 of the second slide rail component 102 (or the first slide rail component 101) disposed outside the sliding component 140 may also be directly against the second display portion 220 of the flexible display component 200.

In the present embodiment, the bump 130 of the slide rail component 100 has a surface 130s facing the cover 11, and the sliding block 140 of the slide rail component 100 has a surface 140s facing the cover 11. For example, the surface 130s of the bump 130 disposed outside the sliding block 140 is substantially coplanar with the surface 140s of the sliding block 140.

In the present embodiment, the bump 130 can be selectively used as a blocking component of the sliding block 140 of the slide rail component 100. That is, by designing the surface 130s of the bump 130 disposed outside the sliding block 140 to be coplanar with the surface 140s of the sliding block 140, it is possible to make the sliding block 140 to be fixed on a corresponding position of the rail 110 according to the size of display area required by the user, thereby avoiding that the sliding block 140 is slid under the influence of unanticipated external force, which affects the user's operation (e.g., watching, touching) comfort.

Figure 11:
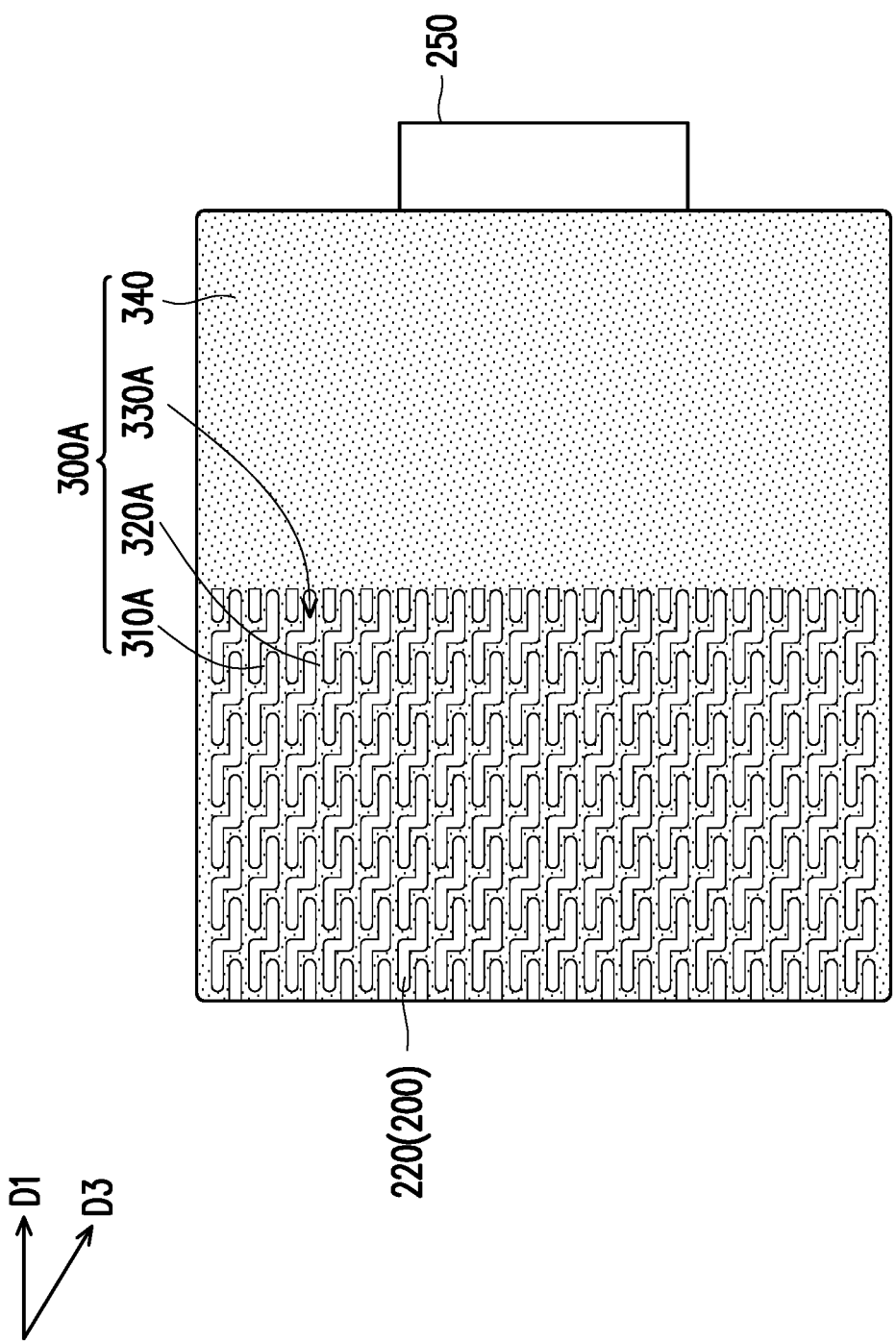
FIG. 11 is a schematic bottom view showing a flexible display component and a support component in an unfolded state according to another embodiment of the present disclosure.
Figure 12:
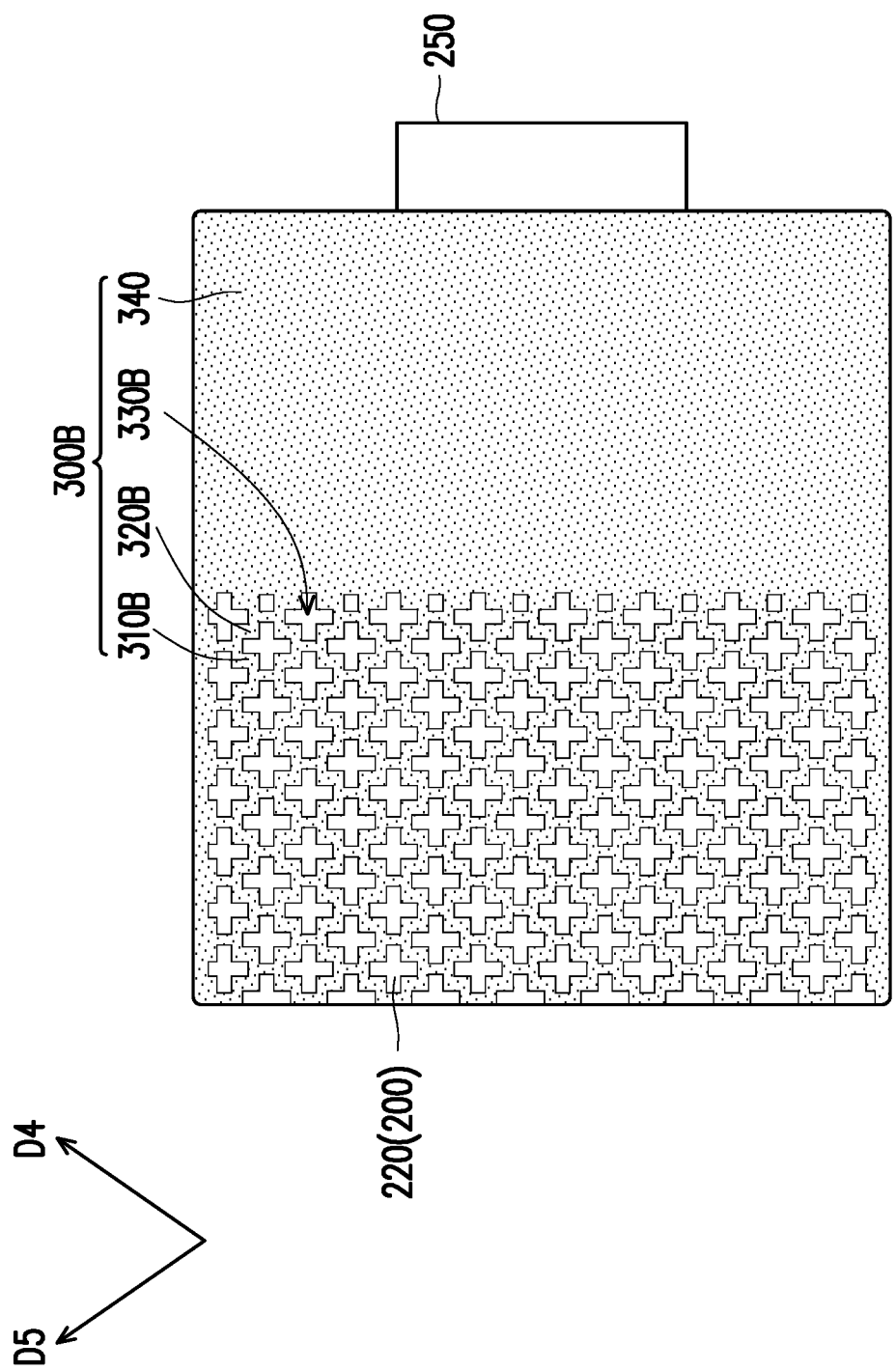
FIG. 12 is a schematic bottom view showing a flexible display component and a support component in an unfolded state according to still another embodiment of the present disclosure.
Figure 13:
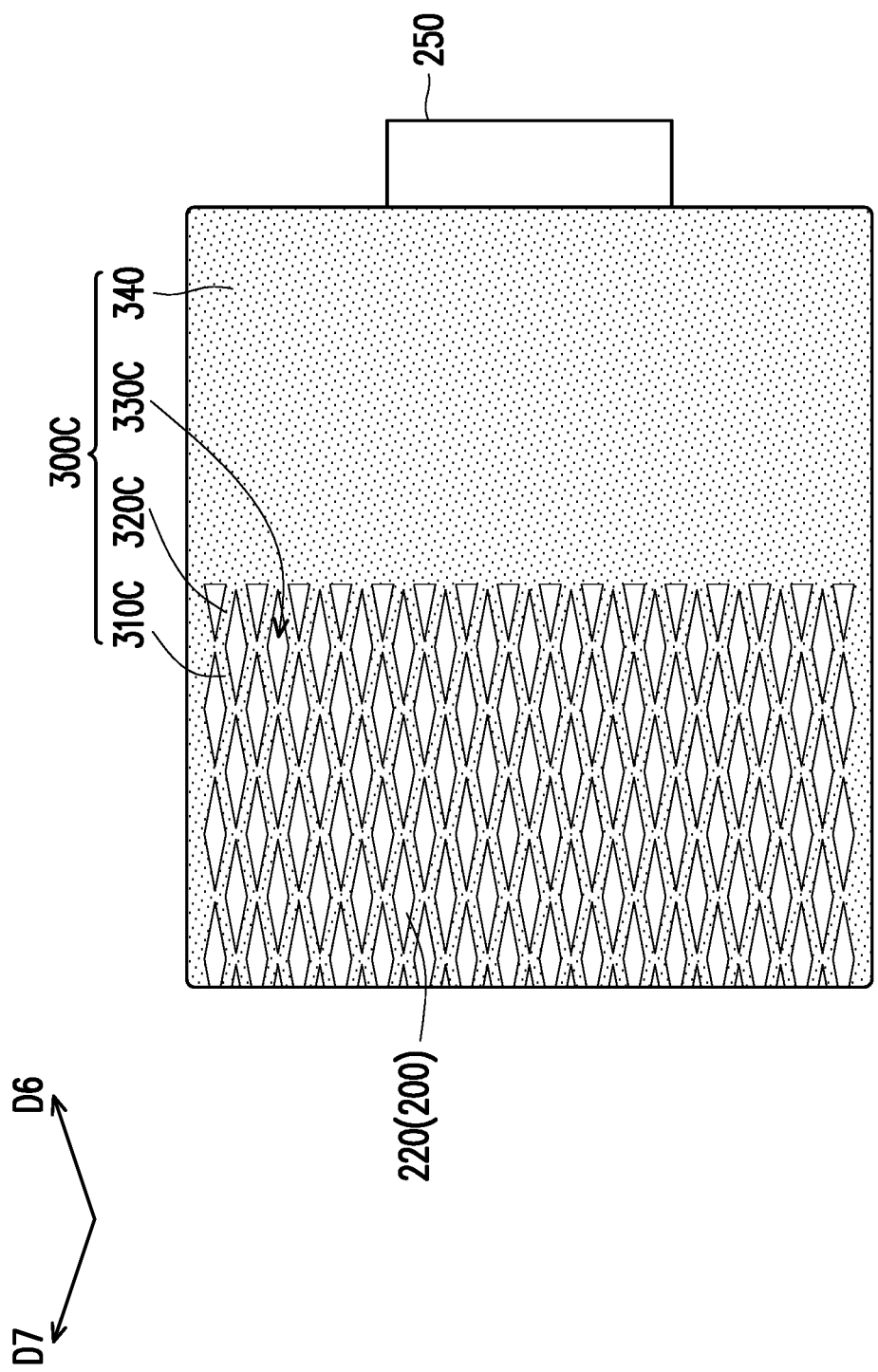
FIG. 13 is a schematic bottom view showing a flexible display component and a support component in an unfolded state according to yet another embodiment of the present disclosure.

FIG. 11 is a schematic bottom view showing a flexible display component 200 and a support component 300A in an unfolded state according to another embodiment of the present disclosure. FIG. 12 is a schematic bottom view showing a flexible display component 200 and a support component 300B in an unfolded state according to still another embodiment of the present disclosure. FIG. 13 is a schematic bottom view showing a flexible display component 200 and a support component 300C in an unfolded state according to yet another embodiment of the present disclosure.

Referring to FIG. 11, in the present embodiment, the first support portion 310A of the support component 300A extends in the direction D3 in a zigzag manner, and the second support portion 320A of the support component 300A extends in the direction D1, and the plurality of first support portions 310A are interlaced with the plurality of second support portions 320A. The plurality of hollow portions 330A defined by the plurality of first support portions 310A and the plurality of second support portions 320A are presented in a Z shape. Through the design of the hollow portion 330A, when the flexible display component 200 and the support component 300A are bent in conformity with the guide roller, it is possible to reduce the stress generated by the flexible display component 200 and the support component 300A at the connection surface.

Referring to FIG. 12, in the present embodiment, the first support portion 310B of the support component 300B extends in the direction D4 in a zigzag manner, and the second support portion 320B of the support component 300B extends in the direction D5 in a zigzag manner, and the plurality of first support portions 310B are interlaced with the plurality of second support portions 320B. The plurality of hollow portions 330B defined by the plurality of first support portions 310B and the plurality of second support portions 320B are presented in a cross shape. Through the design of the hollow portion 330B, when the flexible display component 200 and the support component 300B are bent in conformity with the guide roller, it is possible to reduce the stress generated by the flexible display component 200 and the support component 300B at the connection surface.

Referring to FIG. 13, in the present embodiment, the first support portion 310C of the support component 300C extends in the direction D6, and the second support portion 320C of the support component 300C extends in the direction D7, and the plurality of first support portions 310C are interlaced with the plurality of second support portions 320C. The plurality of hollow portions 330C defined by the plurality of first support portions 310C and the plurality of second support portions 320C are presented in a diamond shape. Through the design of the hollow portion 330C, when the flexible display component 200 and the support component 300C are bent in conformity with the guide roller, it is possible to reduce the stress generated by the flexible display component 200 and the support component 300C at the connection surface.

In summary, the display apparatus according to the embodiment of the present disclosure can fix the sliding block connected to the flexible display component on a corresponding position of the rail through the bump and the elastic element disposed in the recess of the rail depending on the size of the display area needed by the user, thereby avoiding that the sliding block is slid under the influence of unanticipated external force, thus enhancing operation (e.g., watching, touching) comfort for the user. In addition, the display apparatus of the embodiment of the present disclosure connects the flexible display component through the support component having the hollow portion to improve the flatness of the display surface of the flexible display component, while reducing the stress generated on the connection surface when the flexible display component and the support component are bent.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display apparatus, comprising:
   a cover;
   a slide rail component, disposed under the cover, the slide rail component comprising:
   a first rail, having at least one first recess;
   at least one first elastic element, disposed in the at least one first recess;
   at least one first bump, disposed in the at least one first recess and disposed between the cover and the at least one first elastic element; and
   a first sliding block, slidably disposed on the first rail and disposed between the cover and the first rail; and
   a flexible display component, having a first edge, wherein a portion of the first edge is fixed on the first sliding block and disposed between the cover and the first sliding block.

2. The display apparatus according to claim 1, wherein the at least one first elastic element has a deformation, and the at least one first bump is disposed between the first sliding block and the first rail.

3. The display apparatus according to claim 2, wherein the flexible display component is bent, and the portion of the first edge of the flexible display component and the other portion of the first edge of the flexible display component are respectively disposed on opposite sides of the slide rail component.

4. The display apparatus according to claim 1, wherein the other portion of the first edge of the flexible display component extends beyond the first sliding block, and the at least one first bump disposed outside the first sliding block is against said the other portion of the first edge of the flexible display component.

5. The display apparatus according to claim 4, wherein the at least one first bump disposed outside the first sliding block has a surface facing the cover, the first sliding block has a surface facing the cover, the surface of the at least one first bump disposed outside the first sliding block is substantially coplanar with the surface of the first sliding block.

6. The display apparatus according to claim 1, further comprising:
   a support component, disposed between the flexible display component and the first rail, and having a plurality of first support portions and at least one hollow portion disposed between the first support portions, wherein the flexible display component is connected to the support component.

7. The display apparatus according to claim 6, further comprising:
   a guide roller, the flexible display component and the support component are bent in conformity with the guide roller, and the support component is disposed between the flexible display component and the guide roller.

8. The display apparatus according to claim 7, wherein the flexible display component has a display portion that is bent in conformity with the guide roller, and the display portion of the flexible display component and the at least one hollow portion of the support component are disposed on the guide roller.

9. The display apparatus according to claim 6, wherein the first rail of the slide rail component extends in a first direction, and an extending direction of the first support portions of the support component is interlaced with the first direction.

10. The display apparatus according to claim 9, wherein the support component further has a plurality of second support portions interlaced with the first support portions, and an extending direction of the second support portions of the support component is interlaced with the first direction.

11. The display apparatus according to claim 1, wherein the flexible display component further has a second edge opposite to the first edge, the slide rail component further comprising:

a second rail, having at least one second recess;

at least one second elastic element, disposed in the at least one second recess;

at least one second bump, disposed in the at least one second recess, and disposed between the cover and the at least one second elastic element; and a second sliding block, slidably disposed on the second rail, and disposed between the cover and the second rail, wherein a portion of the second edge of the flexible display component is fixed on the second sliding block and disposed between the cover and the second sliding block.

12. A display apparatus, comprising:

a flexible display component, having a display portion;

a support component, connected to the flexible display component and having a plurality of first support portions and at least one hollow portion disposed between the first support portions; and a guide roller, wherein the display portion of the flexible display component and the at least one hollow portion of the support component are disposed on the guide roller.

13. The display apparatus according to claim 12, wherein the flexible display component further has a first display portion, the support component further has a solid portion, and the first display portion of the flexible display component is disposed on the solid portion of the support component.

14. The display apparatus according to claim 12, wherein the display portion of the flexible display component and the first support portion of the support component are bent in conformity with the guide roller, and the support component is disposed between the flexible display component and the guide roller.

15. The display apparatus according to claim 12, wherein the guide roller extends in a first direction, and an extending direction of the first support portions of the support component is interlaced with the first direction.

16. The display apparatus according to claim 15, wherein the support component further has a plurality of second support portions interlaced with the first support portions, and an extending direction of the second support portions of the support component is interlaced with the first direction.

* * * * *